United States Patent [19]

Jung

[11] Patent Number: 5,114,642
[45] Date of Patent: May 19, 1992

[54] PROCESS FOR PRODUCING A METAL-SCREENED CERAMIC PACKAGE

[75] Inventor: Tae Y. Jung, Seoul, Rep. of Korea

[73] Assignee: Samsung Corning Co., Ltd., Suwon, Rep. of Korea

[21] Appl. No.: 553,634

[22] Filed: Jul. 18, 1990

[30] Foreign Application Priority Data

Mar. 30, 1990 [KR] Rep. of Korea ............ 90-4318

[51] Int. Cl.⁵ .................................... C04B 41/88
[52] U.S. Cl. ........................ 264/61; 264/60; 156/89
[58] Field of Search .............. 264/61, 60; 156/89

[56] References Cited

U.S. PATENT DOCUMENTS

| | | | |
|---|---|---|---|
| 3,518,756 | 7/1970 | Bennett | 264/61 |
| 4,109,377 | 8/1978 | Blazick | 264/65 |
| 4,234,367 | 11/1980 | Herron | 264/61 |
| 4,504,339 | 3/1985 | Kamehara | 264/61 |
| 4,971,738 | 11/1990 | Herron | 264/61 |

Primary Examiner—James Derrington
Attorney, Agent, or Firm—Cushman, Darby & Cushman

[57] ABSTRACT

A metal-screened ceramic package is formed by preparing a mixture including a fine metal powder and a coarse metal powder, preheating the metal powder mixture and simultaneously controlling the oxygen partial pressure and dew point in a furnace in which the mixture is pre-conditioned, to thereby form a metal paste, screning the paste on a green ceramic sheet, and co-firing the resulting screened metal paste and the green ceramic sheet in order to control the shrinkage of the metal paste and to provide a uniform sheet resistance.

3 Claims, 1 Drawing Sheet

PROCESS FOR PRODUCING A METAL-SCREENED CERAMIC PACKAGE

BACKGROUND OF THE INVENTION

1. Field of the Invention

The present invention relates to an improved process for producing a metal-screened ceramic package including screening a metal on the green ceramic sheet and co-firing the resulting metal-screened sheet.

2. Description of the Prior Art

Typically, the simultaneous sintering of ceramic is performed in the presence of the mixture gas of hydrogen and nitrogen in a state of humidity wherein the mixture ratio of hydrogen and nitrogen and the dew point of humid mixture gas can control the oxygen partial pressure in the furnace. The controlled oxygen partial pressure according to this method is a function of many parameters including the combustion characteristics of binders during the co-firing process and the sintering characteristics of the metal-ceramic.

FIG. 1 illustrates in typical perspective view a ceramic package, showing a typical process for printing a metal layer on a typical green ceramic sheet. In general, a green ceramic sheet 1 is made by mixing alumina powder with $SiO_2$, CaO, and MgO, which are the main constituents of glass, blending them with a synthetic resin binder such as a hydrocarbon, plasticizer, and solvent, moulding the resulting mixture as a sheet, and drying the resulting green ceramic sheet. A metal pattern is formed on the resulting typical green ceramic sheet by screening onto a surface of the sheet a metal paste which is made by mixing a high melting point metal powder such as tungsten, molybdenum of the like, with binder and solvent. And the resulting metal-screen green ceramic sheet is co-fired at 500°–1650° C. in the presence of hydrogen and nitrogen mixture gas including a given amount of humidity.

At the same time a, glass phase, which is feasible to be wet and is formed on the ceramic by oxidization on the surface of the metal, is moved into the metal layer by the capillary phenomena which is formed between metal particles. The transferred glass phase accelerates the sintering of metal particles depending on the sintering mechanism, such as rearrangement of metal and reextraction of the solution.

Furthermore, the transferred glass phase is solidified during cooling of the fired, metal-screened ceramic sheet, so the adhesive strength of the interface is improved.

During co-firing of metal and ceramic, it is most desirable to have the shrinkage of the metal parts and ceramic parts to be matched. If the shrinkage rates of the metal and ceramic parts are different, the difference causes delamination between the layers, warpage, and weakness of the adhesive strength of the interface due to the stress.

In case of typical paste, it has been tried to change the conditions of metal particle size and distribution, solids in the paste, addition of additives, and the multilayer and sintering environment. U.S. Pat. No. 4,109,377 (Blazick et. al) provided a process described below to form multilayer ceramic substrates. It deposits a particulate mixture of a metal and the oxide thereof in the ratio of between about 1:1 to 9:1 in a pattern on at least a portion of unfired ceramic layers in order to prevent cracking of the ceramic by keeping the shrinkage rate consistent when the metal-coated ceramic is fired. In Blazick et al., the metal has the same thermal properties, such as high conductivity and heat expansion coefficient as the ceramic has. The patterns are then dried. The plurality of substrates or layers of ceramic are then laminated under a substantial pressure (2500 lb/in$^2$) and fired at an elevated temperature in a non-oxidizing atmosphere and, finally laminated ceramic is then cooled at room temperature.

However, it has been very disadvantageous to have to control the, conditions in the furnace very sophisticatedly because the shrinkage rate of the paste produced by the typical process described above is so delicate, depending upon the oxygen partial pressure. Transport phenomena resulting from wetting and capillary properties in the glass phase are changed and, as a result, deviations in the sheet resistance, shrinkage rate, and the strength of the interface are tremendous.

SUMMARY OF THE INVENTION

The present invention is designed for overcoming the difficulties found in the above described prior art, and providing an excellent and feasible process to obtain, ceramic package on which a conductive pattern having a consistent sheet resistance and small deviation of shrinkage rate is printed and on which the shrinkage rate of paste metal can be controlled easily.

In this process, relatively fine metal particles and coarse metal particles are mixed to modulate particle size and distribution, and then the mixture of metal particles, in the form of a paste, is used on the sheet and the coated sheet is subjected to a heating process wherein a mixture gas ratio, a dew point, and an oxygen partial pressure are controlled in a furnace. The metal-screened ceramic package is manufactured by screening the resulting metal paste onto a green ceramic sheet and co-firing the resulting metal-screened, green ceramic sheet.

The object of the invention will more fully appear from the following detailed description when the same is read in connection with the accompanying drawing. It is to be expressly understood, however, that the drawing is for purpose of illustration only and is not intended as a definition of the limits of the invention.

DETAILED DESCRIPTION OF THE PREFERRED EMBODIMENTS

Figure 1:
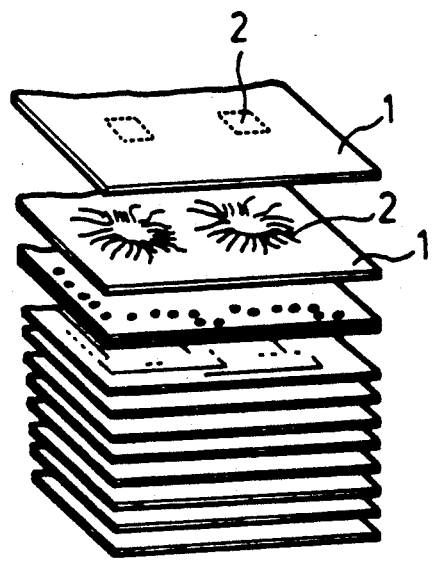
FIG. 1 illustrates the typical perspective view of the ceramic package to print a metal layer in the conventional ceramic green sheet. Because, at the level of detail used in preparing FIG. 1, the metal-screened, green ceramic package of the present invention has virtually the same appearance, this figure can also be said to illustrate the method of the present invention for producing the product described in the detailed description.

According to the process of the present invention, relatively fine metal particles and coarse metal particles are mixed together to modulate particle size and distribution, and then the mixture of metal particles is heated at 100° C.–1400° C., and in the environments of $1\times10^{-9} - 1\times10^{-50}$ atm oxygen partial pressure. The oxygen partial pressure in the furnace is modulated by moldulating the mixture gas ratio and dew point. As the results of this thermo-treating, an oxidized layer is formed on the surface of metal particles and then the metal powder, with a binder and a high melting point solvent are formed into a paste. Finally, the paste is printed on the green ceramic ceramic green sheet, and the resulting metal-screened, green ceramic sheet is co-fired, i.e., the metal coating and green ceramic sheet are fired, together, at the same time.

The sizes of fine and coarse metal particles in this process are most desirable to be approximately 0.5-1.5 μm, and 2-5 μm, respectively.

In the conventional process for producing a metal printed ceramic package, a preliminary heat treatment is not included, even though the mixture gas ratio and dew point are modulated under a controlled oxygen partial pressure. In contrast, practicing the present invention a preliminary heat treatment is carried out to produce an oxidized layer on the metal surface, under a modulated oxygen partial pressure of $1\times10^{-} - 1\times10^{-50}$ atm at 100° C.-1400° C. Therefore, it is possible to control the strength of oxidization on the surface of metal particles by controlling oxygen partial pressure. The following Table 1 shows it is possible to control the shrinkage rate (referring to COMPARATIVE EXAMPLE A and EXAMPLES A-C). In short, the present invention enables one to control the shrinkage rate by controlling the strength of oxidization on the metal surface. Therefore, the present invention can control the penetration of a glass phase into the ceramic, by controlling the strength of oxidization on the metal surface, so it can also control the sintering characteristics of the metal layer.

It is difficult to remove water clinging on the metal powder below 100° C., and also difficult to heat above the melting temperature of metal oxide ($W_{O2}$ is 1473° C.) because melting metal oxide which may be formed on the metal surface. However, it is desirable for tungsten to be heated below 1000° C., since it is self-sintered by metal oxide formed on the surface and necessary to remove it after the thermo-treatment.

The present inventor adapted the binder and solvent for use in the method of the present invention, from the binder and solvent which are described in Matallurgical Transaction, Vol. 1, page 685-694, Mar. 1, 1970.

The metal paste compositions were prepared by using the following empirical relationship:

$$C = a - b \ln D$$

wherein
C is weight of binder and solvent in grams per 100 g of metal
a is a constant (18.65)
b is a constant (2.63)
D is the average particle diameter in microns The binder and solvent was 7 percent ethylcellulose (manufactured by JANSSEN company) including butyl carbitol acetate and αλ-terpineol resulted in a viscosity of 10,000±500 cps.

The process of the present invention can be used to produce a metal printed ceramic package, on which there is provided an excellent pattern which has a remarkably reduced deviation of sheet resistance in the metal layer, compared with typical prior art ceramic packages.

The improvement preventing results from inconsistent penetration of the glass phase, which is due to partial oxidization when the metal-screened green ceramic sheet has the metal and green ceramic materials thereof co-fired.

Moreover, the deviation of adhesive strength in the interface of the metal-ceramic is reduced under the same sintering condition, compared with the conventional process, so that it is possible to obtain consistent properties as shown in TABLE 2 (referring to COMPARATIVE EXAMPLES 1-3 and EXAMPLES 1-3).

Figure 2:
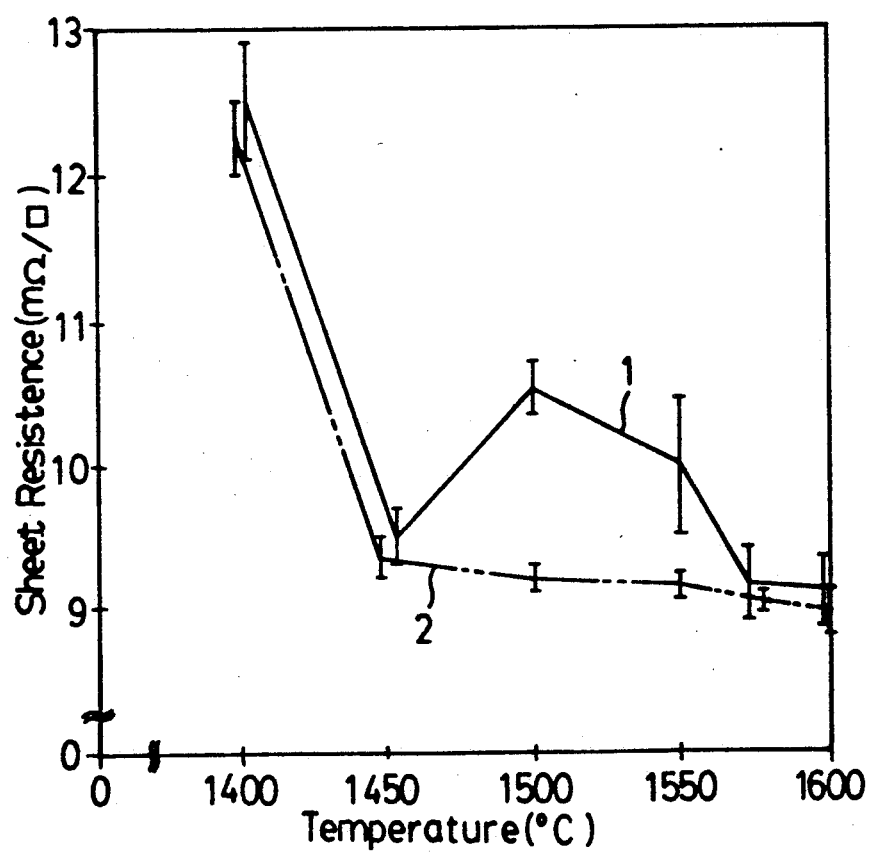
FIG. 2 illustrates for the process of the prior art (solid line) and the process of the present invention (broken line), the variation of sheet resistance of the ceramic package depending upon the sintering temperature thereof.

In case of using metal paste produced by the above-described conventional method, the sintering shrinkage rate of the metal paste is changed with the variation of dew point as shown in the solid line plot in FIG. 2. Actually, it is impossible to maintain a precise dew point in the furnace, so it is imperative to show the change of physical properties of sintering material lot by lot.

In FIG. 2, the curve 1 shows a sheet resistance depending on the sintering temperature of ceramic package, which is produced by co-firing using typical paste, and the curve 2 shows the deviation of sheet resistance depending on the sintering temperature of a ceramic package, produced by the method of the present invention. As illustrated in FIG. 2, an excellent ceramic package can be produced, which has consistent sheet resistance and a remarkably reduced deviation of sheet resistance at the same temperature (referring to COMPARATIVE EXAMPLES 7-12 and EXAMPLES 7-12).

TABLE 3, shows comparative data with regard to shrinkage rate of ceramic packages which are obtained by typical method using a conventional paste and by use of the method of the invention, with control of the dew point. As shown in TABLE 3, the deviation of shrinkage rate at each dew point in the present invention is remarkably reduced, compared with use of the above-described conventional method for producing a typical ceramic package, so the method of the present invention produces an excellent ceramic package which has a consistent distribution of shrinkage rate (referring to COMPARATIVE EXAMPLES 4-6 and EXAMPLES 4-6).

As described above, the process of the present invention can control the shrinkage of the metal paste in accordance with the strength of the oxidization of metal surface. According to the process of the present invention, a conductive circuit having a uniform sheet resistance can be also provided. The process of the invention can provide a sintering body which exhibits a small deviation in the adhesive strength of the interface when subjected to the same sintering conditions as used in the process of the prior art. Also the process of the present invention can provide a metal paste which exhibits a relatively small deviation of the shrinkage with changes in the oxygen partial pressure in the furnace.

The following EXAMPLES are included merely to aid in the understanding of the invention and variations may be made by one skilled in the art without departing from the sprit and the scope of the invention.

EXAMPLES A to C

A green ceramic sheet was provided in the form of a high purity sheet composed of 89% $Al_2O_3$, 8.25% $SiO_2$, 1.35% MgO, and 1.43% CaO, by weight. An organic binder was provided, including (as a solvent), toluene (as a wetting agent), alkyl ether of polyethylene glycol sold under the trade name of "Tergitol" by Carbide and Carbon Chemicals Company, and (as a plasticizing agent), butyl benzyl phthalate.

The green ceramic sheet was made according to the milling technique described in U.S. Pat. No. 3518756. Then fine and coarse tungsten powder, having particle sizes of about 1 micron and 3 microns, respectively, were mixed in the ratio of 1 to 3 by weight. The average particle size was controlled to be about 2.5 microns. 100 grams of the powder mixture was inserted in three-roll mixer with 16.24 grams of binder and solvent composition as described above, using the above disclosed empirical relationship.

A metal paste was made by controlling the conditions of the mixer to provide the three environments described in TABLE 1, and preheating the three metal pastes to about 800°. The metal paste were then screened on like samples of the ceramic samples green sheet. The resulting ceramic were then co-fired to form respective ceramic packages. The results of the shrinkage are given in the TABLE 1 under the headings EX. A, EX. B, and EX. C, respectively.

COMPARATIVE EXAMPLE (A)

The same conventional process for providing the green ceramic sheet samples described in EXAMPLES A to C was utilized in providing a green ceramic sheet sample for this COMPARATIVE EXAMPLE A.

Also, a tungsten metal paste was made by using a prior art technique wherein the average tungsten particle size is about 3 microns and also the tungsten powder was mixed with binder and solvent as described above using the same empirical relationship.

The paste was screened on the ceramic sheet and the resulting metal-screened, green ceramic sheet was then co-fired at 1600° C. to form a ceramic package. The results of the shrinkage of this comparative sample are given in the TABLE 1 under the heading COM. EX. A.

TABLE 1

|  | COM. EX. A | EX. A | EX. B | EX. C |
|---|---|---|---|---|
| oxygen partial pressure (800° C.) (atm) | — | $1 \times 10^{-20}$ | $5 \times 10^{-20}$ | $1 \times 10^{-19}$ |
| sintering shrinkage (1600° C.) (%) | 16.5–16.7 | 16.7–17.0 | 16.5–17.05 | 17.3–17.51 |

EXAMPLES 1 to 3

The process of EXAMPLE A was followed except for controlling the oxygen partial pressure to $1 \times 10^{-20}$ atm to form a metal paste. The metal paste was screened on the green ceramic sheet of EXAMPLE A. A ceramic package was made by using the same method as was used in EXAMPLE A, except the sintering conditions were varied as described in TABLE 2. The results of the adhesive strength of the interface are also given in TABLE 2.

COMPARATIVE EXAMPLES 1 to 3

The process of COMPARATIVE EXAMPLE A was repeated, with the exception that the sintering conditions were varied as described in EXAMPLES 1 to 3, respectively. The results of the adhesive strength of the interface are also described in TABLE 2.

TABLE 2

| Condition | EX. No. | adhesive strength of the interface (Kg/mm$^2$) |
|---|---|---|
| H$_2$/N$_2$ = 15:85 | COM. EX. 1 | 2.2–3.1 |
| 1575° C.* | EX. 1 | 2.8–3.2 |
| H$_2$/N$_2$ = 20:80 | COM. EX. 2 | 2.4–3.2 |
| 1575° C.* | EX. 2 | 2.7–3.3 |
| H$_2$/N$_2$ = 25:75 | COM. EX. 3 | 2.1–2.9 |
| 1575° C.* | EX. 3 | 2.6–3.0 |

*is a sintering temperature.

EXAMPLES 4 to 6

The procedure of EXAMPLE A was followed, except that the oxygen partial pressure was changed into $1 \times 10^{-20}$ atm, and each of the dew points was changed to the respective temperature listed in the TABLE 3. The results of the shrinkage are also given in TABLE 3.

COMPARATIVE EXAMPLES 4 to 6

The process of COMPARATIVE A was repeated, except for the variation of the dew point as described in TABLE 3. The results of the shrinkage are also given in TABLE 3.

TABLE 3

| dew point (°C.) | EX. No. | Sintering shrinkage (1600° C., %) |
|---|---|---|
| 25 | COM. EX. 1 | 16.8–17.2 |
|  | EX. 1 | 16.9–17.2 |
| 30 | COM. EX. 2 | 17.3–17.51 |
|  | EX. 2 | 17.2–17.45 |
| 35 | COM. EX. 3 | 17.42–18.0 |
|  | EX. 3 | 17.5–17.8 |

EXAMPLES 7 to 12

Six tungsten metal pastes were made by the method of EXAMPLE A except for the variations of $1 \times 10^{-20}$ atm in oxygen partial pressure and 30° C. in dew point and were then screened on the green ceramic sheet. The metal-screened sheets were co-fired in the environment of H$_2$/O$_2$ in the ratio of 15 to 85 in volume percent at the sintering temperature of 1400° C., 1450° C., 1500° C., 1550° C., 1575° C., or 1600° C. to form respective ceramic packages. The results of the sheet resistance are given in TABLE 4.

COMPARATIVE EXAMPLES 7–12

Six typical tungsten metal pastes were formed by utilizing the method of COMPARATIVE EXAMPLE A and were then screened on the green ceramic sheet. The resulting sheets were co-fired, using the same conditions as were used in the EXAMPLES 7-12, respectively. The results of the sheet resistance are also given in TABLE 4.

TABLE 4

| Sintering Temperature (°C.) | EX. No. | Sheet resistance (m·Ω/□) |
|---|---|---|
| 1400 | COM. EX. 7 | 12.1–12.9 |
|  | EX. 7 | 12.0–12.5 |
| 1450 | COM. EX. 8 | 9.3–9.7 |
|  | EX. 8 | 9.2–9.5 |
| 1500 | COM. EX. 9 | 10.35–10.73 |
|  | EX. 9 | 9.1–9.3 |
| 1550 | COM. EX. 10 | 9.5–10.47 |
|  | EX. 10 | 9.05–9.24 |
| 1575 | COM. EX. 11 | 8.9–9.4 |
|  | EX. 11 | 8.95–9.1 |
| 1600 | COM. EX. 12 | 8.85–9.35 |

TABLE 4-continued

| Sintering Temperature (°C.) | EX. No. | Sheet resistance (m · Ω/□) |
|---|---|---|
| | EX. 12 | 8.80–9.12 |

What is claimed is;

1. A method for preparing a metal-screened ceramic package, comprising:

providing a green ceramic sheet having a given composition, said sheet having a surface;

mixing a first component of fine metal particles of a given composition selected from the group consisting of tungsten and molybdenum, and having a particle size in the range of 0.5 to 1.5 μm, with a second component of coarse metal particles of said given composition and having a particle size in the range of 2.0 to 5.0 μm;

heating the resulting metal particle mixture to a temperature in the range of 100° C. to 1400° C., in a furnace, at an oxygen partial pressure in the range of $1 \times 10^{-9}$ to $1 \times 10^{-50}$, in the presence of hydrogen and nitrogen gases, and thereby oxidizing said metal particles of said metal particle mixture on exposed surfaces thereof;

mixing the resultingly partially oxidized metal particle mixture with a binder and solvent so as to form a metal paste;

screen printing said metal paste in a pattern on said surface of said green ceramic sheet;

co-firing the resulting metal paste pattern and said green ceramic sheet at a temperature in the range of 500° C. to 1650° C. in the presence of hydrogen and nitrogen gases in the volumetric $H_2/N_2$ ratio of 15 to 85; and permitting the resulting metal-screened ceramic sheet to cool.

2. The method of claim 1, wherein:

said green ceramic sheet is made of a mixture of $SiO_2$, CaO and MgO with a synthetic resin binder.

3. The method of claim 1, wherein:

said fine metal particles and coarse metal particles are present in said metal particle mixture in a weight-basis ratio of about 1:3, and said metal particle mixture has an average particle size of about 2.5 μm.

* * * * *